United States Patent
Ok et al.

(10) Patent No.: US 10,741,559 B2
(45) Date of Patent: Aug. 11, 2020

(54) SPACER FOR TRENCH EPITAXIAL STRUCTURES

(71) Applicant: INTERNATIONAL BUSINESS MACHINES CORPORATION, Armonk, NY (US)

(72) Inventors: Injo Ok, Loudonville, NY (US); Balasubramanian Pranatharthiharan, Watervliet, NY (US); Soon-Cheon Seo, Glenmont, NY (US); Charan V. V. S. Surisetty, Clifton Park, NY (US)

(73) Assignee: ELPIS TECHNOLOGIES INC., Ottawa (CA)

( * ) Notice: Subject to any disclaimer, the term of this patent is extended or adjusted under 35 U.S.C. 154(b) by 0 days.

(21) Appl. No.: 16/423,727

(22) Filed: May 28, 2019

(65) Prior Publication Data

US 2019/0296015 A1 Sep. 26, 2019

Related U.S. Application Data

(63) Continuation of application No. 15/972,547, filed on May 7, 2018, now Pat. No. 10,347,632, which is a continuation of application No. 14/880,658, filed on Oct. 12, 2015, now Pat. No. 10,020,306.

(51) Int. Cl.
*H01L 21/70* (2006.01)
*H01L 27/092* (2006.01)
*H01L 21/8238* (2006.01)

(52) U.S. Cl.
CPC .. *H01L 27/0924* (2013.01); *H01L 21/823814* (2013.01); *H01L 21/823821* (2013.01); *H01L 21/823864* (2013.01)

(58) Field of Classification Search
CPC ......... H01L 27/0924; H01L 21/823821; H01L 21/823814; H01L 21/823864
See application file for complete search history.

(56) References Cited

U.S. PATENT DOCUMENTS

| | | |
|---|---|---|
| 6,440,791 B1 | 8/2002 | Gau |
| 7,348,233 B1 | 3/2008 | Gerhardt et al. |
| 8,093,107 B1 | 1/2012 | Nemati et al. |
| 9,397,003 B1 * | 7/2016 | Niimi ............. H01L 21/823418 |
| 10,020,306 B2 | 7/2018 | Ok et al. |
| 2009/0221117 A1 | 9/2009 | Tan et al. |
| 2015/0044831 A1 | 2/2015 | Tung et al. |

(Continued)

OTHER PUBLICATIONS

List of IBM Patents or Patent Applications Treated as Related dated May 28, 2019; 1 page.

(Continued)

*Primary Examiner* — Mohammad M Hoque
(74) *Attorney, Agent, or Firm* — Michael McCartney; Andrew M. Calderon; Roberts Calderon Safran & Cole, P.C.

(57) ABSTRACT

The disclosure relates to a structure and methods of forming spacers for trench epitaxial structures. The method includes: forming a spacer material between source and drain regions of respective first-type gate structures and second-type gate structures; growing source and drain material about the first-type gate structures, confined within an area defined by the spacer material; and growing source and drain material about the second-type gate structures, confined within an area defined by the spacer material.

17 Claims, 5 Drawing Sheets

(56) References Cited

U.S. PATENT DOCUMENTS

| | | |
|---|---|---|
| 2015/0054089 A1* | 2/2015 | Hong .................... H01L 21/762 |
| | | 257/401 |
| 2015/0064905 A1 | 3/2015 | Tsai |
| 2016/0247805 A1 | 8/2016 | Basker et al. |
| 2016/0351566 A1 | 12/2016 | Niimi et al. |
| 2017/0103984 A1 | 4/2017 | Ok et al. |
| 2018/0226492 A1* | 8/2018 | Mehandru ......... H01L 29/66742 |
| 2018/0254274 A1 | 9/2018 | Ok et al. |
| 2018/0254275 A1 | 9/2018 | Ok et al. |

OTHER PUBLICATIONS

Fffice Action issued in U.S. Appl. No. 16/421,673 dated Oct. 24, 2019, 15 pages.

* cited by examiner

SPACER FOR TRENCH EPITAXIAL STRUCTURES

BACKGROUND

The invention relates to semiconductor structures and, more particularly, to structure and methods of forming spacers for trench epitaxial structures.

As semiconductor devices become smaller, spacing between gate structures continue to shrink in scale. In finFET technologies, for example, the N to P fin to fin spacing is becoming very narrow in static random access memory (SRAM) as well as other devices. This narrow spacing can lead to shorting of the source and drain regions of the gate structures of these different devices due to epitaxial (epi) overgrowth when forming the drain and source regions. Accordingly, the N-type epi and the P-type epic can short each other.

SUMMARY

In an aspect of the invention, a method includes: forming a spacer material between source and drain regions of respective first-type gate structures and second-type gate structures; growing source and drain material about the first-type gate structures, confined within an area defined by the spacer material; and growing source and drain material about the second-type gate structures, confined within an area defined by the spacer material.

In an aspect of the invention, a method includes: forming first type of gate structures and second type of gate structures; forming a spacer on sidewalls of the first type of gate structures and the second type of gate structures; and forming a low-k dielectric spacer material defining trenches for source and drain regions of the first type of gate structures and the second type of gate structures which confines epitaxial source and drain material from shorting between the adjacent ones of the first type of gate structures and the second type of gate structures.

In an aspect of the invention, a structure includes: a plurality of p-type finFET devices; a plurality of n-type finFET devices; and a low-k dielectric spacer material defining trenches for source and drain regions of the plurality of p-type finFET devices and the plurality of n-type finFET devices and which confines epitaxial source and drain material from shorting between adjacent ones of the plurality of p-type finFET devices and the plurality of n-type finFET devices due a spacing of fins.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to structures and methods of forming spacers for trench epitaxial structures. In embodiments, the methods described herein can be used to form equal CMOS spacer thickness for trench epitaxial structures. The methods described herein can be implemented in a finFET gate last process, e.g., replacement metal gate process, or a finFET first gate process. Moreover, the methods described herein can be implemented in many different technologies, including but not limited, to planar gate technologies and extremely thin semiconductor-on-insulator (ETSOI) FET technologies, amongst others. The methods described herein can also be implemented with any elemental semiconductor materials (e.g., silicon, germanium, carbon, or alloys thereof), III-V semiconductor materials, or II-VI semiconductor materials, as examples.

The structures described herein can be manufactured in a number of ways using a number of different tools. In general, though, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Figure 1:
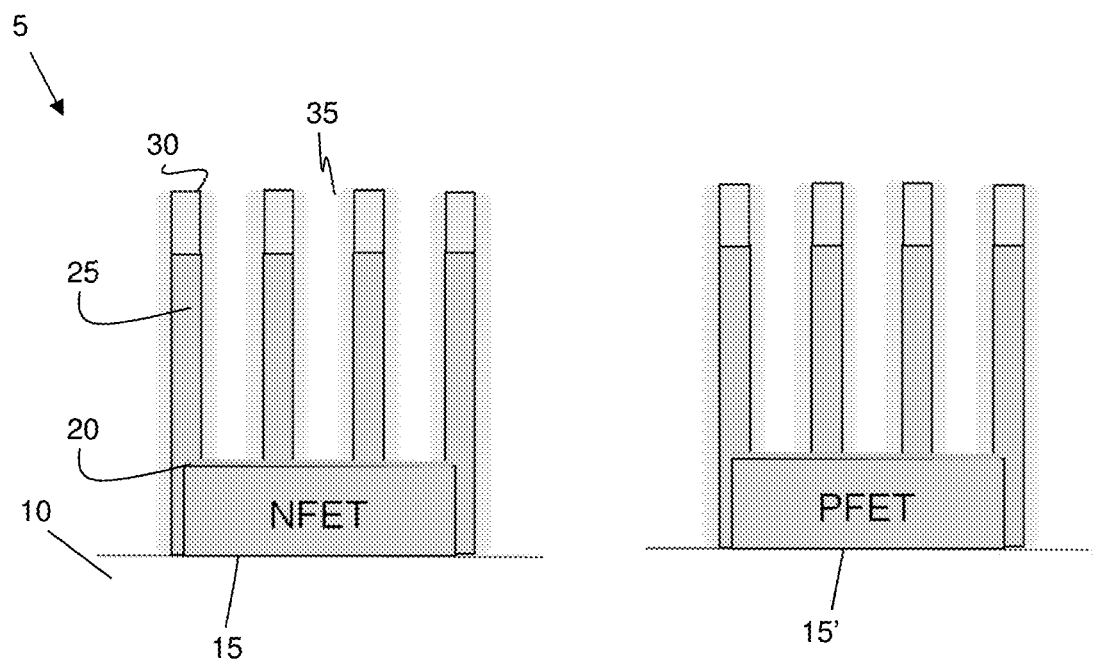
FIG. 1 shows a beginning structure and respective fabrication processes in accordance with aspects of the invention.

FIG. 1 shows a structure and respective fabrication processes in accordance with aspects of the invention. In particular, the structure 5 of FIG. 1 shows a plurality of fins 15, 15'. In exemplary embodiments, the fin 15 can be used with NFET devices; whereas, the fin 15' can be used with PFET devices. The fins 15, 15' can be formed from semiconductor material such as, e.g., elemental semiconductor materials (e.g., silicon, germanium, carbon, or alloys thereof), III-V semiconductor materials, or II-VI semiconductor materials, as examples. The fins 15, 15' can be formed on an insulator material such as a buried oxide layer 10 of a silicon-on-insulator (SOI) substrate.

In embodiments, the fins 15, 15' can be formed using conventional lithography and etching processes. For example, the fins 15, 15' can be formed using a sidewall image transfer (SIT) technique. In the SIT technique, for example, a mandrel material, e.g., $SiO_2$, is deposited on the semiconductor material using conventional chemical vapor deposition (CVD) processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fins 15, 15'. Spacers are formed on the sidewalls of the mandrels which are preferably material that is different than the mandrels, and which are formed using conventional deposition processes known to those of skill in the art. The spacers can have a width which matches the dimensions of the fins 15, 15', for example. The mandrels are removed or stripped using a conventional etching process, selective to the mandrel material. An etching is then performed within the spacing of the spacers to form the sub-lithographic features, e.g., fins 15, 15'. The sidewall spacers can then be stripped using conventional stripping process, e.g., oxygen ashing.

Still referring to FIG. 1, a gate dielectric material 20 is blanket deposited on the fins 15, 15' using conventional deposition methods. In embodiments, the gate dielectric material 20 can be different materials depending on the processes, e.g., gate first or gate last processes, or desired device parameters. For example, the gate dielectric material 20 can be a high-k dielectric material, e.g., $HfO_2$, in a gate first process, deposited prior to the source/drain formation processes. Alternatively, in a gate last process, the gate dielectric material 20 can be oxide, deposited after the source/drain formation processes. In any of the embodiments, the gate dielectric material 20 can be deposited to a thickness of about 2 nm to about 5 nm for a gate pitch of less than 80 nm; although other dimensions are also contemplated by the present invention.

Gate structures 25 with a capping layer 30 are formed over the gate dielectric material 20. The gate structures 25 with capping layer 30 are formed by blanket deposition of gate material on the gate dielectric material 20, followed by blanket deposition of a capping material. In embodiments, the gate material can be amorphous silicon or any other gate material, and the capping material can be nitride material. Following the deposition processes, a conventional lithography and etching processes is performed to pattern the gate structures 25 each with a capping layer 30. In embodiments, the gate structures 25 with the capping layer 30 can be formed with a single lithography exposure, double patterning (e.g., lithography, etch, lithography etch, or lithography, lithography and etch) or SIT process, as examples.

A spacer 35 of low-k dielectric material, e.g., nitride, is blanket deposited on the sidewalls of the gate structures 25 and over each of the capping layer 30. The spacer 35 can also be formed from SiN, $SiO_2$, SiOCN, SiBCN, or any low-K material (K<6). The deposition process of the low-k dielectric material 35 can be, e.g., atomic layer deposition (ALD) or CVD. The spacer 35 can undergo an optional etching process (e.g., reactive ion etching (RIE) to remove material from the upper surface of the capping layer 30 and the gate dielectric material 20. The spacer 35 can have a thickness of about 5 Å to about 6 Å for a gate pitch of 80 nm; although other dimensions are also contemplated by the present invention.

Figure 2:
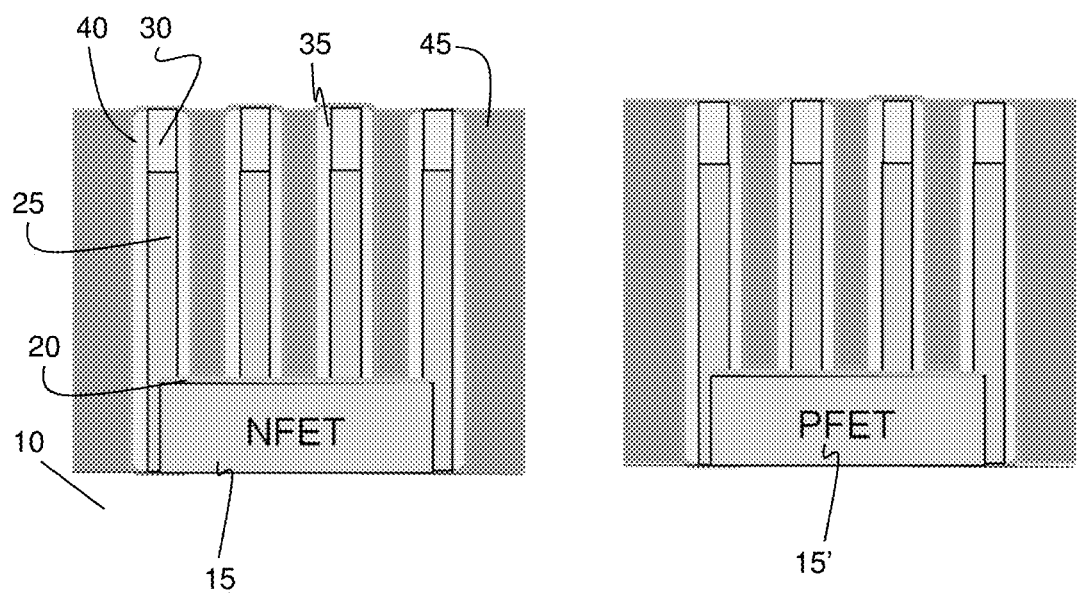
FIG. 2 shows additional fabrication processing steps and a respective structure in accordance with aspects of the invention.

As shown in FIG. 2, a capping material 40 is deposited on the spacer material 35 and exposed surfaces of the capping layer 30 and the gate dielectric material 20. In embodiments, the capping layer 30 can be a low-k dielectric material such as nitride material or an oxide material, deposited using an ALD process. The capping material 40 can be deposited to a thickness of about 2 nm to 5 nm; although other dimensions are also contemplated by the present invention.

Still referring to FIG. 2, a sacrificial fill material 45 is deposited over the capping material, followed by a chemical mechanical polishing (CMP) process to expose the capping material 40 on the top of the capping layer 30. In embodiments, the sacrificial fill material 45 is amorphous silicon (a-Si). As alternative options, the sacrificial fill material 45 can be a high-k protective layer, nitride or a combination of high-k dielectric material and nitride and then a-Si. As further alternative options, the sacrificial fill material 45 can be amorphous carbon (a-Carbon) and a low temperature epitaxial material, or high temperature containing material. In yet further alternative embodiments, the sacrificial fill material 45 can be ash a-Carbon selective to Si or SiGe, with a deposition of low temperature oxide or nitride.

Figure 3:
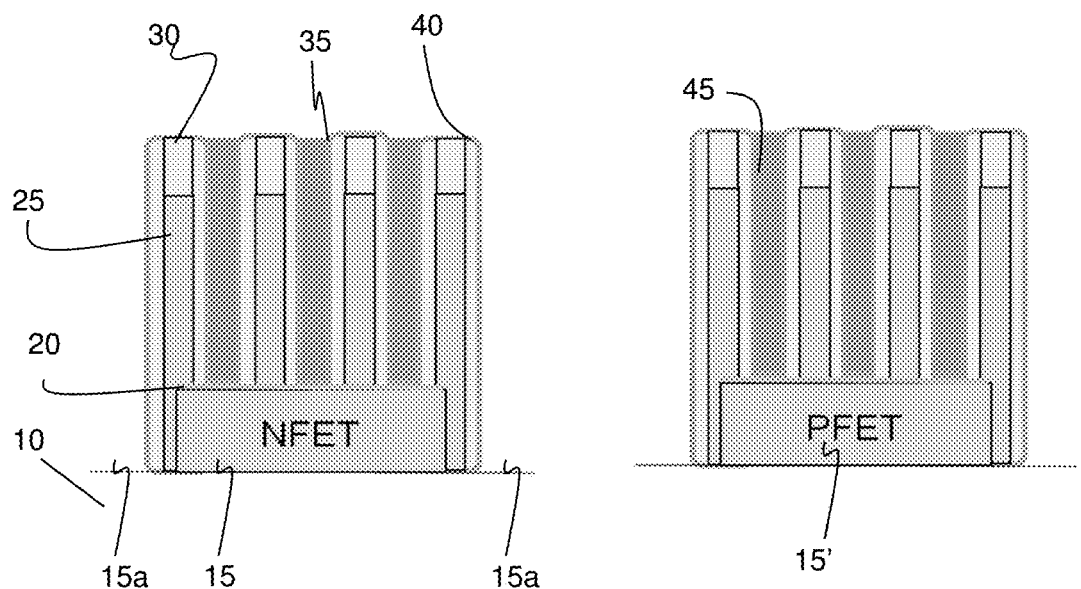
FIG. 3 shows additional fabrication processing steps and a respective structure in accordance with aspects of the invention.

FIG. 3 shows a source/drain patterning for both PFET and NFET devices. In embodiments, the source/drain patterning comprises removing the sacrificial fill material 45 between the NFET and PFET devices. This etching process comprises a conventional lithography and etching process such that further explanation is not needed for one of ordinary skill in the art to understand the present invention. In this etching process, the capping material 40 can act as an etch stop.

Figure 4A:
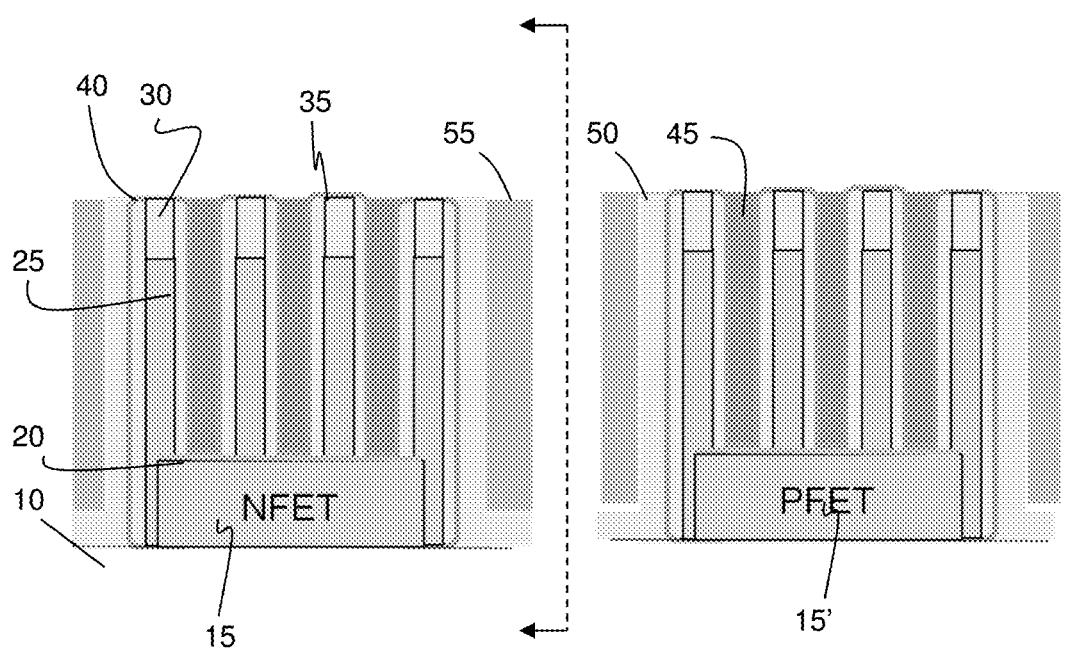
FIGS. 4A and 4B show the formation of a spacer material between fins of an NFET and PFET side of a structure, amongst other features, in accordance with aspects of the invention, with FIG. 4B representing a cross-sectional view of FIG. 4A.
Figure 4B:
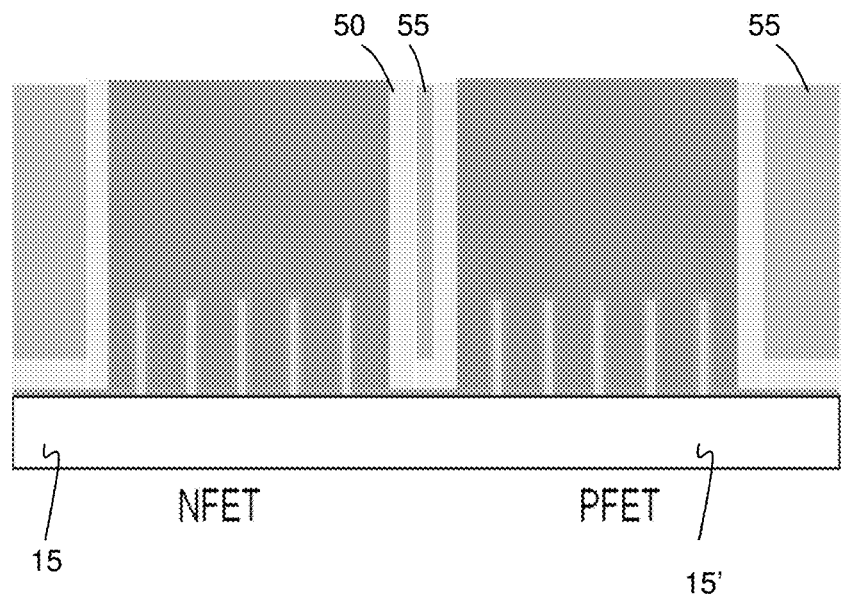

Referring now to FIGS. 4A and 4B, spacer material 50 is formed on the capping material 40 and other exposed areas of the structure, e.g., source and drain regions of adjacent PFET and NFET devices 15, 15'. As should be understood by those of skill in the art, the spacer material 50 will prevent epitaxial overgrowth from wrapping around the gate structures 25 and shorting source to drain regions between the PFET and NFET devices, even with narrow fin to fin spacing as shown in the cross-sectional view of FIG. 4B. In embodiments, the spacer material 50 can be any low-k dielectric material such as, e.g., SiN, SiBCN, SiOCN, carbon containing nitride, etc. The spacer material 50 can be deposited using a conventional CVD process, and can have equal spacer thickness for trench epitaxial structures as described herein.

Still referring to FIGS. 4A and 4B, an interlevel dielectric material 55 is deposited on the spacer material 50. In embodiments, the interlevel dielectric material 55 can be a middle of the line (MOL) oxide or other low-k dielectric material. The interlevel dielectric material 55 can be deposited using a conventional CVD process. The materials, e.g., spacer material 50 and interlevel dielectric material 55, can then undergo a planarization process such as a CMP process, which will expose the capping material 40 (formed on a surface of the capping layer 30).

Figure 5A:
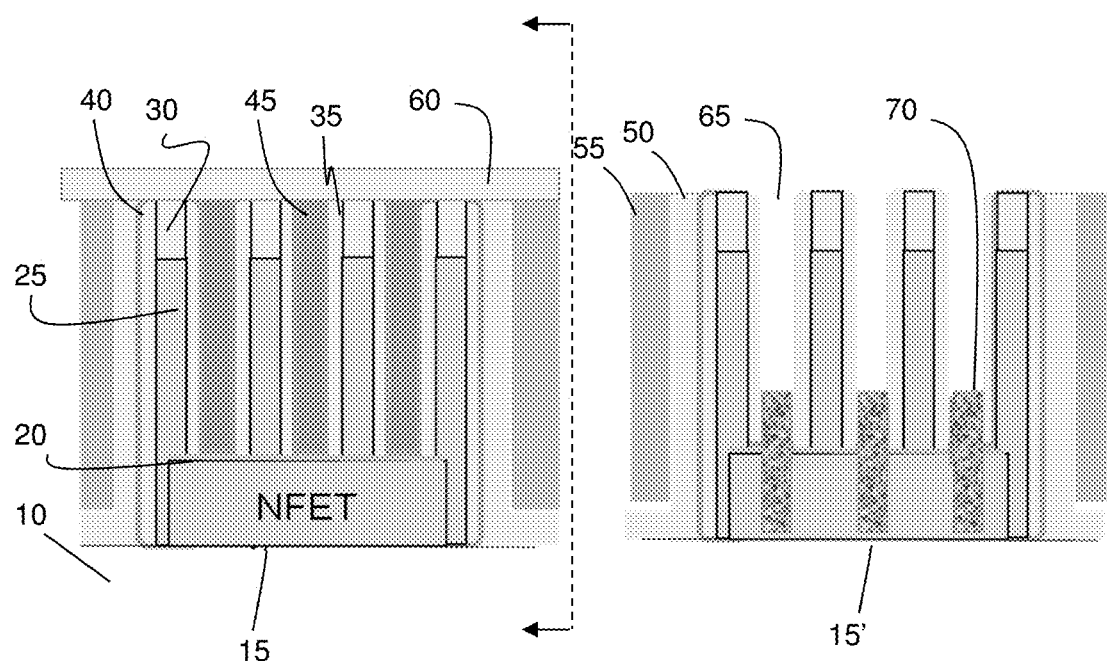
FIGS. 5A and 5B show the formation of epitaxially grown source/drain regions, amongst other features, in accordance with aspects of the invention, with FIG. 5B representing a cross-sectional view of FIG. 5A.
Figure 5B:
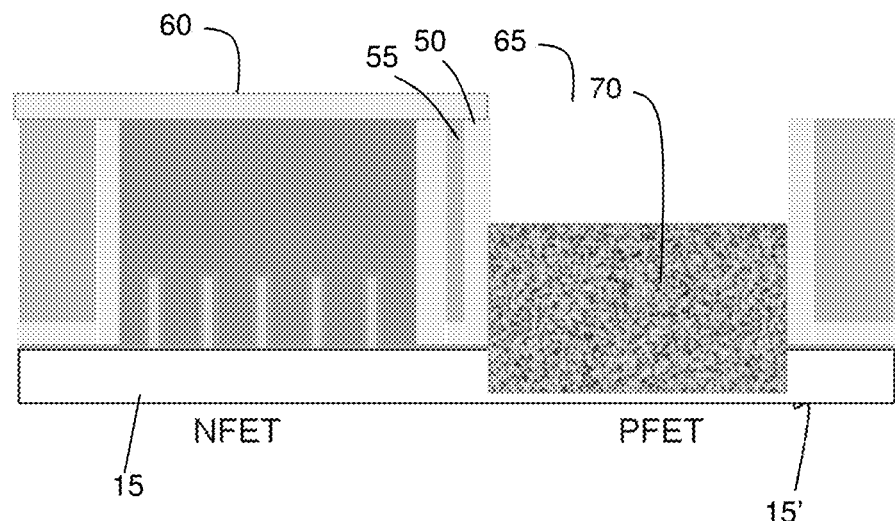

As shown in FIGS. 5A and 5B, a mask 60 is formed on the NFET side 15 of the structure. The mask 60 can be a nitride material 60, which is patterned using conventional lithography and etching (RIE) processes. On the PFET side 15' of the structure, the sacrificial material is removed between the gate structures 25, forming trenches 65. The capping material 40 can also be removed from the surface of the fin structure, e.g., over the gate dielectric material 20 of the PFET side 15'. The capping material 40 can be removed by an isotropic etching process, selective to the material of the capping material 40. An epitaxial material 70 is grown in the trenches 65, between the gate structures 25. In embodiments, the epitaxial material 70 is a PFET material used to form raised source and drain regions, e.g., boron. As shown in FIG. 5B, for example, the spacer material 50 will prevent epitaxial overgrowth from wrapping around the gate structures 25 and shorting source to drain regions between the PFET and NFET devices, even with narrow fin to fin spacing in SRAM and other devices.

In embodiments, the epitaxial material 70 can be doped, e.g., boron doped, or, in optional embodiments, the epitaxial material 70 can be undoped in which case an ion implantation process well known to those of ordinary skill in the art would be performed on the epitaxial grown material. In embodiments, the epitaxial material can be Si or compounds thereof, e.g., SiGe.

Figure 6:
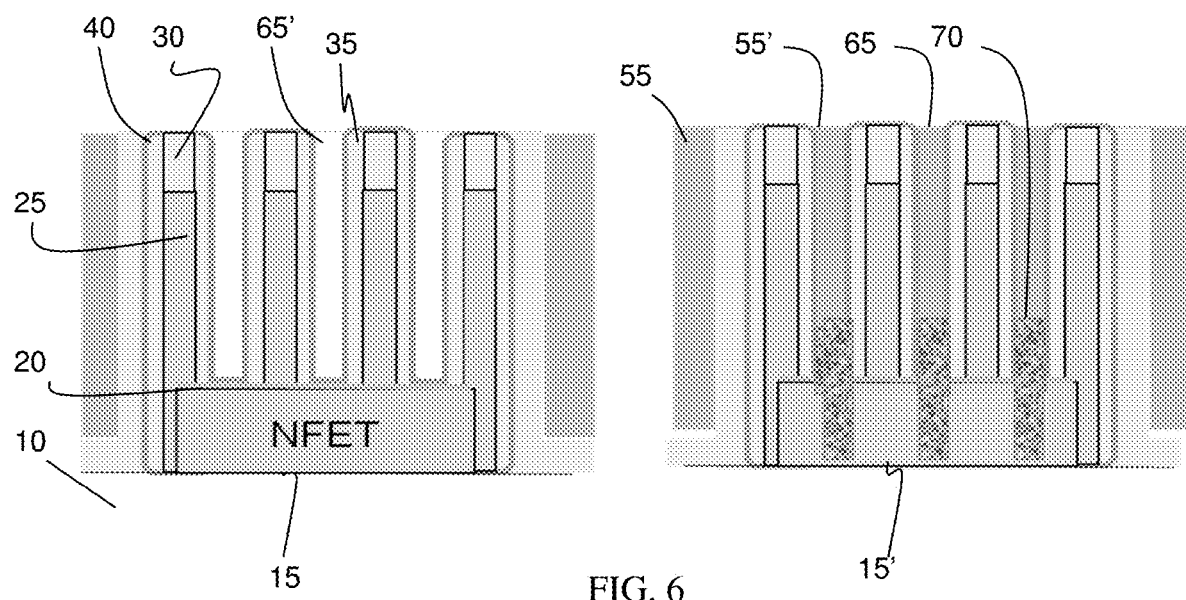
FIG. 6 shows additional fabrication processing steps and respective structure in accordance with aspects of the invention.

In FIG. 6, the trenches 65 can be filled with a capping material 55'. In embodiments, the capping material 55' should be a different material than that of the sacrificial fill material 45. In this way, the capping material 55' will protect the epitaxial material 70 during a subsequent etching process of the sacrificial fill material 45 on the NFET side 15 of the structure. In embodiments, the spacer 35 can undergo an etching after removing the sacrificial fill material 45. In embodiments, the capping material 55' will also allow a subsequent etching or removal of the sacrificial fill material 45 without the need for any additional lithography process, e.g., depositing and patterning of a resist material. The etching process of the sacrificial fill material 45 on the NFET side 15 of the structure will form trenches 65'.

In embodiments, the capping material 55' can be formed by a blanket deposition of material, e.g., using a CVD process. The capping material 55' can be nitride, oxide or a-Si or other material that is different than the sacrificial fill material 45. For example, if the sacrificial fill material 45 is a-Si, then the capping material 55' should be an oxide or nitride, as an example. A CMP process will follow the deposition of the capping material 55'. As with other CMP processes described herein, the CMP process will planarize the capping material 55' and expose surfaces of the capping material 40 deposited on the upper surface of the capping layer 30 on the gate structures 25. Following the CMP process, an etching process (e.g., RIE) if performed to form the trenches 65' on the NFET side 15 of the structure.

Figure 7A:
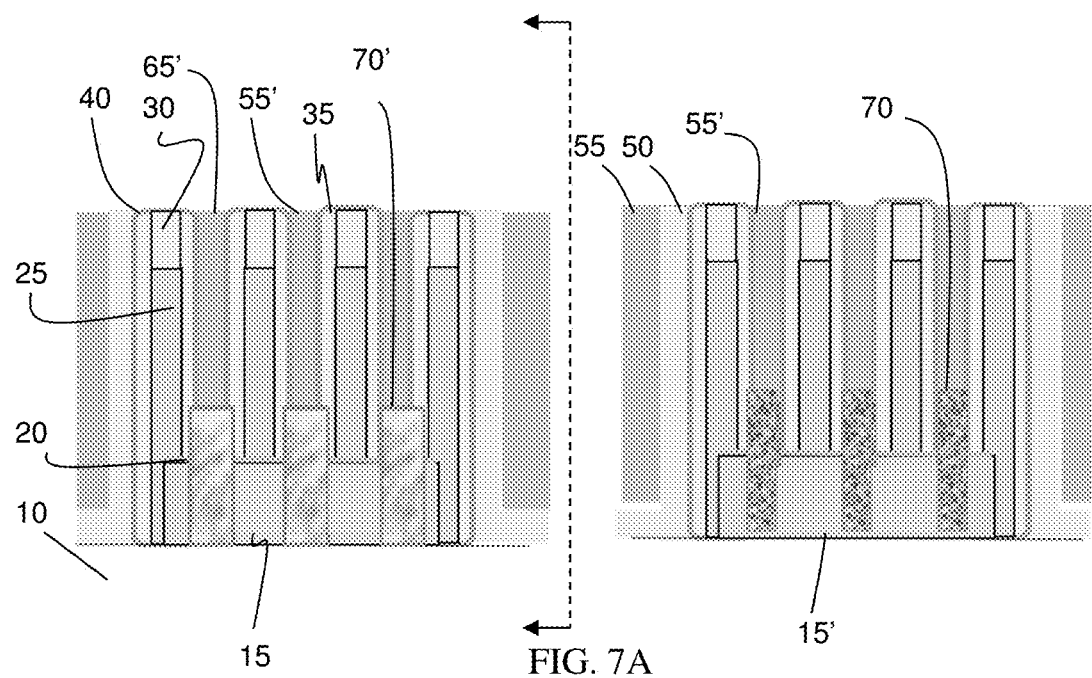
FIGS. 7A and 7B show the formation of epitaxially grown source/drain regions, amongst other features, in accordance with aspects of the invention, with FIG. 7B representing a cross-sectional view of FIG. 7A.
Figure 7B:
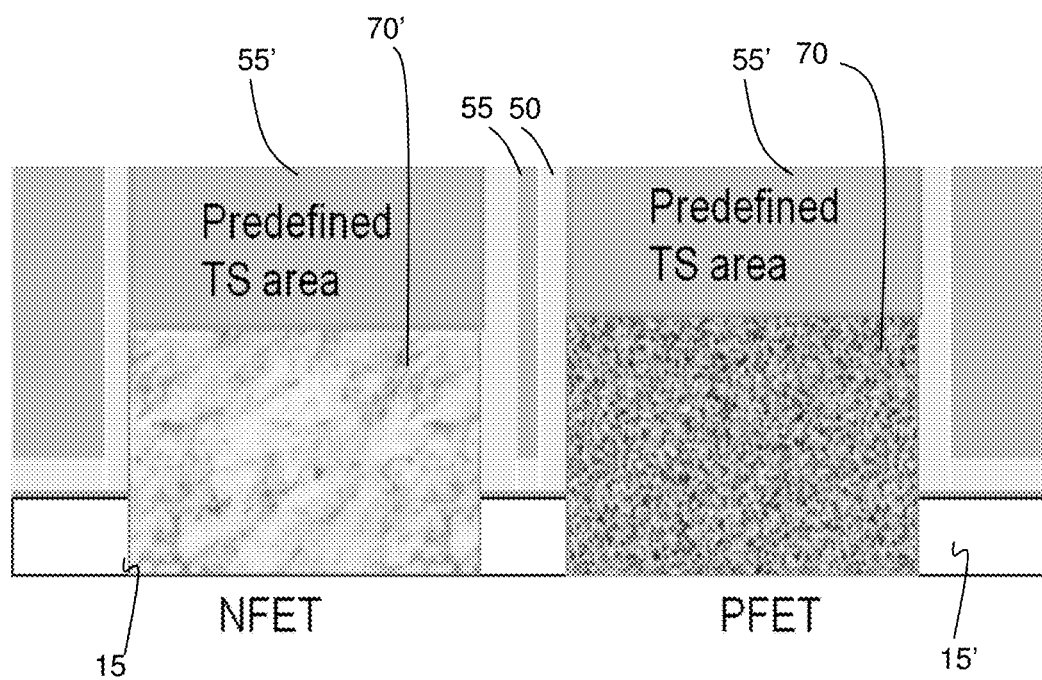

As shown in FIGS. 7A and 7B, similar to the PFET side of the structure, the capping material 40 can be removed from the surface of the fin structure, e.g., over the gate dielectric material 20 of the NFET side 15. The capping material 40 can be removed by an isotropic etching process, selective to the material of the capping material 40. An epitaxial material 70' is grown in the trenches 65', between the gate structures 25. In embodiments, the epitaxial material 70' is an NFET material used to form raised source and drain regions, e.g., arsenic. As shown in FIG. 7B, for example, the spacer material 50 will prevent epitaxial overgrowth from wrapping around the gate structures 25 and shorting source to drain regions between the PFET and NFET devices, even with narrow fin to fin spacing in SRAM and other devices.

In embodiments, the epitaxial material 70' can be doped, e.g., arsenic doped or phosphorous, or, in optional embodiments, the epitaxial material 70' can be undoped in which case an ion implantation process well known to those of ordinary skill in the art would be performed on the epitaxial grown material. In embodiments, the epitaxial material can be Si or compounds thereof, e.g., SiP or SiCP.

Still referring to FIGS. 7A and 7B, the trenches 65' can be filled with the capping material 55'. In embodiments, the capping material 55' will protect the epitaxial material 70' during subsequent processing steps. The capping material 55' can be formed by a blanket deposition of material, e.g., using a CVD process. The capping material 55' can be nitride, oxide or a-Si or other material as described herein. The capping material 55' can also represent or define a predefined trench structure (TS) area between the source and drain regions of the NFET 15 and the PFET 15', bounded or defined by the spacer material 50. This predefined area will confine the epitaxially grown source and drain regions of the NFET 15 and PFET 15', hence ensuring that the source and drain regions of the NFET 15 and PFET 15' will not wrap around the gate and short due to narrow fin to fin spacing.

A CMP process will follow the deposition of the capping material 55'. As with other CMP processes described herein, the CMP process will planarize the capping material 55' and expose surfaces of the capping material 40 deposited on the upper surface of the capping layer 30 on the gate structures 25.

It should be recognized by those of skill in the art that the present invention also contemplates the formation of epitaxial grown source/drain regions on the NFET side, prior to the PFET side. This can be accomplished by simply reversing the order of the of the steps described herein, starting with FIGS. 5A and 5B. Accordingly, the present invention should not be limited to the order of processing steps described above.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming source and drain material confined within an area defined by a single spacer material; and
   subsequent to the forming the source and drain material, forming a plurality of first-type gate structures and a plurality of second-type gate structures separated from the plurality of the first-type gate structures by the single spacer material, the single spacer material preventing shorting between adjacent ones of the plurality of first-type gate structures and the plurality of second-type gate structures due to a spacing of fins.

2. The method of claim 1, further comprising:
   forming additional spacer material on sidewalls of the first-type gate structures and the second-type gate structures and over a first capping layer; and forming the single spacer material on a second capping layer in source and drain regions between the first-type gate structures and the second-type gate structures.

3. The method of claim 2, wherein the single spacer material is a low-k dielectric material which defines trench structures for the source and drain material for the first-type gate structures and the second-type gate structures.

4. The method of claim 2, wherein the additional spacer material is nitride or oxide material.

5. The method of claim 2, wherein the forming the source and drain material is an epitaxial growth process.

6. The method of claim 1, wherein the first-type gate structures are p-type devices and the second-type gate structures are n-type devices.

7. The method of claim 1, wherein the first-type gate structures are p-type finFET devices and the second-type gate structures are n-type finFET devices.

8. The method of claim 2, further comprising:
forming the first capping layer on the plurality of the first-type gate structures and the plurality of the second-type gate structures;
forming a first spacer material on sidewalls of the plurality of the first-type gate structures and the plurality of the second-type gate structures and over the first capping layer;
forming the second capping layer on the first spacer material; and
forming the single spacer material on the second capping layer between the plurality of the first-type gate structures and the plurality of the second-type gate structures.

9. The method of claim 8, wherein the single spacer material defines trench structures for the source and drain material for the plurality of the first-type gate structures and the plurality of the second-type gate structures.

10. The method of claim 1, wherein the single spacer material is formed on a single side of two gate structures of the plurality of the first-type gate structures and on a single side of two gate structures of the plurality of the second-type gate structures.

11. The method of claim 10, wherein the two gate structures of the plurality of the first-type gate structures are adjacent to respective ones of the two gate structures of the plurality of the second-type gate structures.

12. The method of claim 1, wherein the forming the plurality of the first-type gate structures and the plurality of the second-type gate structures comprises:
forming the fins using a sidewall image transfer technique;
depositing a gate dielectric material comprising an oxide on the fins;
depositing gate material on the gate dielectric material; and
depositing a capping material on the gate material.

13. The method of claim 12, wherein the gate dielectric material is blanket deposited on the fins to a thickness of 2 nm to 5 nm.

14. The method of claim 13, wherein a gate pitch is less than 80 nm.

15. The method of claim 1, wherein the single spacer material prevents epitaxial overgrowth of the source and drain material.

16. The method of claim 1, wherein the single spacer material is SiN, SiBCN, SiOCN, or carbon containing nitride.

17. The method of claim 16, further comprising depositing the single spacer material using a chemical vapor deposition process.

* * * * *